United States Patent
Ichikawa

(10) Patent No.: US 11,960,678 B2
(45) Date of Patent: Apr. 16, 2024

(54) PROXIMITY DETECTION DEVICE TO DETECT A USER'S APPROACH TO A DISPLAY SURFACE COMPRISING A SENSITIVITY SETTING UNIT

(71) Applicant: ALPINE ELECTRONICS, INC., Tokyo (JP)

(72) Inventor: Teiichi Ichikawa, Iwaki (JP)

(73) Assignee: ALPINE ELECTRONICS, INC., Tokyo (JP)

( * ) Notice: Subject to any disclaimer, the term of this patent is extended or adjusted under 35 U.S.C. 154(b) by 751 days.

(21) Appl. No.: 17/143,451

(22) Filed: Jan. 7, 2021

(65) Prior Publication Data
US 2021/0232259 A1      Jul. 29, 2021

(30) Foreign Application Priority Data

Jan. 29, 2020   (JP) .................................. 2020-012603

(51) Int. Cl.
   *G01S 17/04*   (2020.01)
   *G06F 3/041*   (2006.01)

(52) U.S. Cl.
   CPC ............ *G06F 3/0418* (2013.01); *G01S 17/04* (2020.01)

(58) Field of Classification Search
   CPC ... G06F 3/04; G06F 3/01; G01S 17/04; G01S 17/02; G01S 17/88
   USPC .............................................. 250/214 R, 221
   See application file for complete search history.

(56) References Cited

U.S. PATENT DOCUMENTS 11,580,787 B2 *   2/2023   Yanagimoto .......... G01S 7/4808
2016/0173087 A1   6/2016   Skipper

FOREIGN PATENT DOCUMENTS

| DE | 102009036369 A1 | 2/2011 |
| JP | 2013-195326 | 9/2013 |
| JP | 2019-74465 | 5/2019 |
| WO | WO2020003914 A1 | 1/2020 |

OTHER PUBLICATIONS

Extended European Search Report for 21152683.5 dated Jun. 18, 2021, 10 pgs.
Japanese Office Action dated Aug. 29, 2023 in corresponding Japanese Patent Application No. 2020-012603 with English translation.

* cited by examiner

*Primary Examiner* — Que Tan Le
(74) *Attorney, Agent, or Firm* — Crowell & Moring LLP

(57) ABSTRACT

Four infrared LEDs and two photodiodes PD are arranged below a lower side of a display surface in the order of an LED1, a PD1, an LED2, an LED3, a PD2, and an LED4. A detection signal A1 of the PD1 when the LED1 emits light, a detection signal A2 of the PD1 when the LED2 emits light, a detection signal A3 of the PD2 when the LED3 emits light, and a detection signal A4 of the PD2 when the LED4 emits light are used to estimate a reflection generation position in the left-right direction, and a threshold Th is set such that the threshold Th increases when the reflection generation position is on the left side, which is a driver's seat side. If the maximum value of A1, A2, A3, and A4 exceeds the threshold Th, the approach of the user's hand is detected.

10 Claims, 13 Drawing Sheets

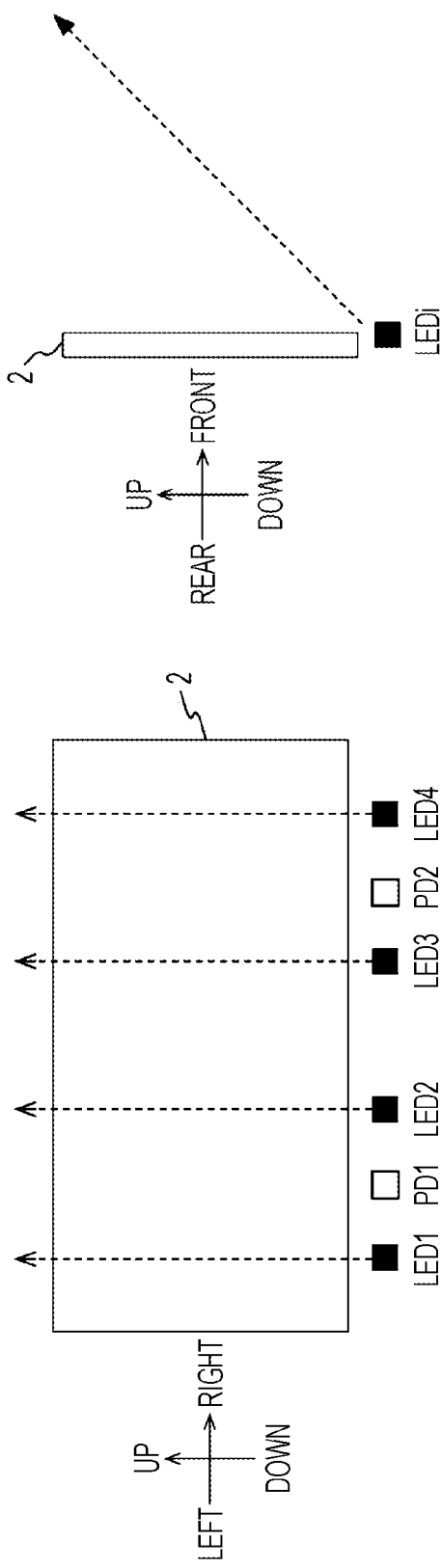
FIG. 3A
FIG. 3B
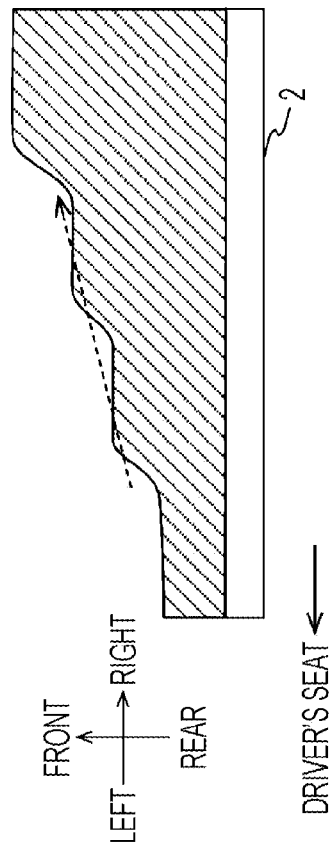
FIG. 3C
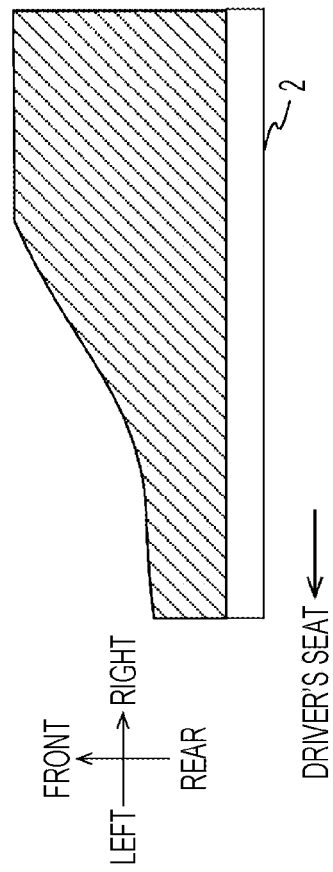
FIG. 3D

US 11,960,678 B2

PROXIMITY DETECTION DEVICE TO DETECT A USER'S APPROACH TO A DISPLAY SURFACE COMPRISING A SENSITIVITY SETTING UNIT

RELATED APPLICATION

The present application claims priority to Japanese Patent Application Number 2020-012603, filed Jan. 29, 2020, the entirety of which is hereby incorporated by reference.

BACKGROUND

1. Field of the Invention

The present invention relates to a technique for detecting an approach of a user's hand to a display surface of a display.

2. Description of the Related Art

As a technique for detecting an approach of a user's hand to a display surface of a display, there is known a detection system that emits infrared light to the front and upper side of the display from several infrared LEDs arrayed from left to right below a lower side of the display surface of the display, detects reflected light of the infrared light reflected by the user's hand with a photodiode to detect the approach of the user's hand to the display surface of the display, and receives an operation on the display (for example, JP 2019-74465 A).

Here, this detection system is arranged between a driver's seat and a passenger's seat on a dashboard of an automobile, is provided with a dedicated infrared LED that emits infrared light from the display toward the driver's seat so as not to receive a driver's operation on other devices such as a wiper lever as an operation on the display, and is configured to suppress the detection of the approach of the user's hand when the photodiode detects the reflected light having a strong intensity of the infrared light emitted by the dedicated infrared LED.

According to the above detection system, the dedicated infrared LED that emits the infrared light from the display toward the driver's seat is required so as not to receive the driver's operation on other devices as an operation on the display.

In addition, when a user brings his/her hand close to the display surface of the display to actually operate the display, there is a case where the reflected light having the strong intensity of the infrared light emitted by the dedicated infrared LED is detected by the photodiode depending on an approaching mode of the hand so that the operation on the display is not received.

SUMMARY

Therefore, an object of the present disclosure is to suppress erroneous detection of an operation on another device as an approach of a user's hand to a display surface of a display without using a dedicated infrared LED that emits infrared light from the display toward a driver's seat.

To achieve the above object, the present disclosure provides a proximity detection device that detects a user's approach to a display surface of a display with: a plurality of infrared light sources that are arrayed along a first side, which is one side of the display surface, outside the display surface of the display and emit infrared light passing the front of the display surface; one or a plurality of light detectors arranged outside the display surface; a proximity detection unit that detects the user's approach to the display surface with a set sensitivity using an intensity of reflected light of the infrared light emitted by each of the infrared light sources detected by the light detector; and a sensitivity setting unit that estimates a first-direction position, which is a position where reflection occurs in a first direction which is a direction along the first side, according to the intensity of the reflected light of the infrared light emitted by each of the infrared light sources detected by the light detector and sets the sensitivity of the proximity detection unit to a sensitivity determined according to the estimated first-direction position and a preset relationship between the first-direction position and the sensitivity.

Such a proximity detection device may be configured such that the sensitivity setting unit calculates a center of gravity of an intensity distribution of the reflected light of the infrared light detected by the light detector as a value indicating the first-direction position.

In addition, in the above proximity detection device, the display may be arranged at a position between a driver's seat and a passenger's seat in a left-right direction of an automobile, and the first direction may coincide with the left-right direction of the automobile. In addition, in this case, the preset relationship between the first-direction position and the sensitivity may be a relationship where the sensitivity is lower in a case where the first-direction position is a position within an area close to the driver's seat of the display surface than in a case where the first-direction position is in an area close to the passenger's seat of the display surface.

In addition, the above proximity detection device may be configured such that the proximity detection unit detects the user's approach to the display surface when a maximum value of the intensity of the reflected light of the infrared light emitted by the infrared light source, detected by the light detector for each of the plurality of infrared light sources, exceeds a set threshold, the relationship between the first-direction position and the sensitivity is defined as a relationship between the first-direction position and the threshold, and the sensitivity setting unit sets the threshold of the proximity detection unit to a threshold determined according to the estimated first-direction position and the preset relationship between the first-direction position and the threshold.

According to the proximity detection device as described above, the sensitivity for detection of the approach of the user's hand can be arbitrarily set for each position in the direction along the first side of the display surface using only the plurality of infrared light sources arrayed along the first side of the display surface and the light detector which are used to detect the approach of the user's hand to the display surface.

Then, since the sensitivity of the area close to the driver's seat of the display surface is set to be low, it is possible to suppress the erroneous detection of an operation on another device as the approach of the user's hand to the display surface of the display without using the dedicated infrared LED that emits the infrared light from the display toward the driver's seat.

Here, the above proximity detection device in which the display is arranged at a position between the driver's seat and the passenger's seat in the left-right direction of the automobile may include a plurality of light detectors arrayed along the first side as the light detector, and may be configured such that the proximity detection unit detects the user's approach to the display surface when an intensity of reflected light of the infrared light, represented by a first detected reflection intensity of emitted light of each of the infrared light sources, exceeds a set threshold using the intensity of the reflected light of the infrared light emitted by the infrared light source, detected by the light detector at a position relatively close to the infrared light source having emitted the infrared light, as the first detected reflection intensity of the emitted light of the infrared light source, for each of the plurality of infrared light sources. The relationship between the first-direction position and the sensitivity is defined as a relationship between the first-direction position and the threshold. The sensitivity setting unit sets the threshold of the proximity detection unit to a threshold determined according to the estimated first-direction position and the preset relationship between the first-direction position and the threshold, and sets the threshold of the proximity detection unit to a threshold obtained by adjusting the threshold to a smaller threshold, instead of the threshold determined according to the relationship when both an intensity of reflected light of infrared light emitted by an infrared light source near a driver's seat, detected by a light detector relatively far from the infrared light source near the driver's seat, and the first detected reflection intensity of the infrared light source near the driver's seat are larger than a predetermined level.

As a result, it is possible to prevent the approach of the user's hand from being undetectable in a portion far from the first side, that is, a portion away from the infrared light source in the area close to the driver's seat since the sensitivity of the area close to the driver's seat of the display surface is set to be low.

Note that the proximity detection device may include four infrared LEDs arrayed along the lower side of the display as the plurality of infrared light sources, and include two photodiodes as the light detector, that is, a photodiode arranged at a position between the infrared LED arranged on the leftmost side and the second infrared LED from the left and a photodiode arranged at a position between the infrared LED arranged on the rightmost side and the second infrared LED from the right.

In addition, in order to achieve the above-described object, the present disclosure provides a proximity detection device that detects a user's approach to a display surface of a display with: a plurality of infrared light sources that are arrayed along a first side, which is one side of the display surface, outside the display surface of the display and emit infrared light passing the front of the display surface; a plurality of infrared light sources that are arrayed along a second side of the display surface, which is a side opposing the first side, outside the display surface and emit infrared light passing the front of the display surface; one or a plurality of light detectors arranged outside the display surface; a proximity detection unit that detects the user's approach to the display surface with a set sensitivity using an intensity of reflected light of the infrared light emitted by each of the infrared light sources detected by the light detector; and a sensitivity setting unit that estimates a first-direction position, which is a position where reflection in a first direction occurs, according to intensities of beams of reflected light of infrared light emitted by a plurality of infrared light sources having different positions in the first direction, which is a direction along the first side, detected by the light detector, estimates a second-direction position, which is a position where reflection in a second direction occurs, according to intensities of beams of reflected light of infrared light emitted by a plurality of infrared light sources having different positions in the second direction, which is a direction along a side perpendicular to the first side, detected by the light detector, and sets the sensitivity of the proximity detection unit to a sensitivity determined according to the estimated first-direction position and second-direction position and a preset relationship among the first-direction position, the second-direction position, and the sensitivity.

Here, such a proximity detection device may be configured such that the sensitivity setting unit calculates a center of gravity of an intensity distribution, obtained using coordinates of the intensities of beams of reflected light of infrared light detected by the light detector as ordered elements in an array along the first direction of the infrared light sources having emitted the infrared light, as a value indicating the first-direction position, and calculates a center of gravity of the intensity distribution, obtained using coordinates of the intensities of beams of reflected light of infrared light detected by the light detector as ordered elements in an array along the second direction of the infrared light sources having emitted the infrared light, as a value indicating the second-direction position.

In addition, such a proximity detection device may include two infrared LEDs arranged in an up-down direction on the left side of the display surface of the display as the plurality of infrared light sources arrayed along the first side, include two infrared LEDs arranged in the up-down direction on the right side of the display surface of the display as the plurality of infrared light sources arrayed along the second side, and include, as the light detector, a photodiode arranged at a position between the two infrared LEDs arranged in the up-down direction on the left side of the display surface and a photodiode arranged at a position between the two infrared LEDs arranged in the up-down direction on the right side of the display surface.

According to the above proximity detection device, the sensitivity for detection of the approach of the user's hand can be arbitrarily set for each position in the left-right and up-down directions of the display surface using only the plurality of infrared light sources arrayed along the first side of the display surface, the plurality of infrared light sources arrayed along the second side of the display surface, and the light detector which are used to detect the approach of the user's hand to the display surface.

Therefore, since the sensitivity of the area close to the driver's seat of the display surface is set to be low, it is possible to suppress the erroneous detection of an operation on another device as the approach of the user's hand to the display surface of the display without using the dedicated infrared LED that emits the infrared light from the display toward the driver's seat.

In addition, the present disclosure also provides a display unit including the above proximity detection device and the display integrated with the proximity detection device. In addition, the present disclosure also provides an information processing system including the above proximity detection device, the display, and a data processing device using the display for display output. In this information processing system, when detecting the user's approach to the display surface, the proximity detection device notifies the data processing device of the approach.

As described above, according to the present disclosure, it is possible to suppress the erroneous detection of an operation on another device as the approach of the user's hand to the display surface of the display without using the dedicated infrared LED that emits the infrared light from the display toward the driver's seat.

BRIEF DESCRIPTION OF THE DRAWINGS

FIGS. 3A to 3D are views illustrating an arrangement and a detection area of a proximity detection sensor according to the first embodiment of the present invention;

DETAILED DESCRIPTION OF THE PREFERRED EMBODIMENTS

Figure 1:
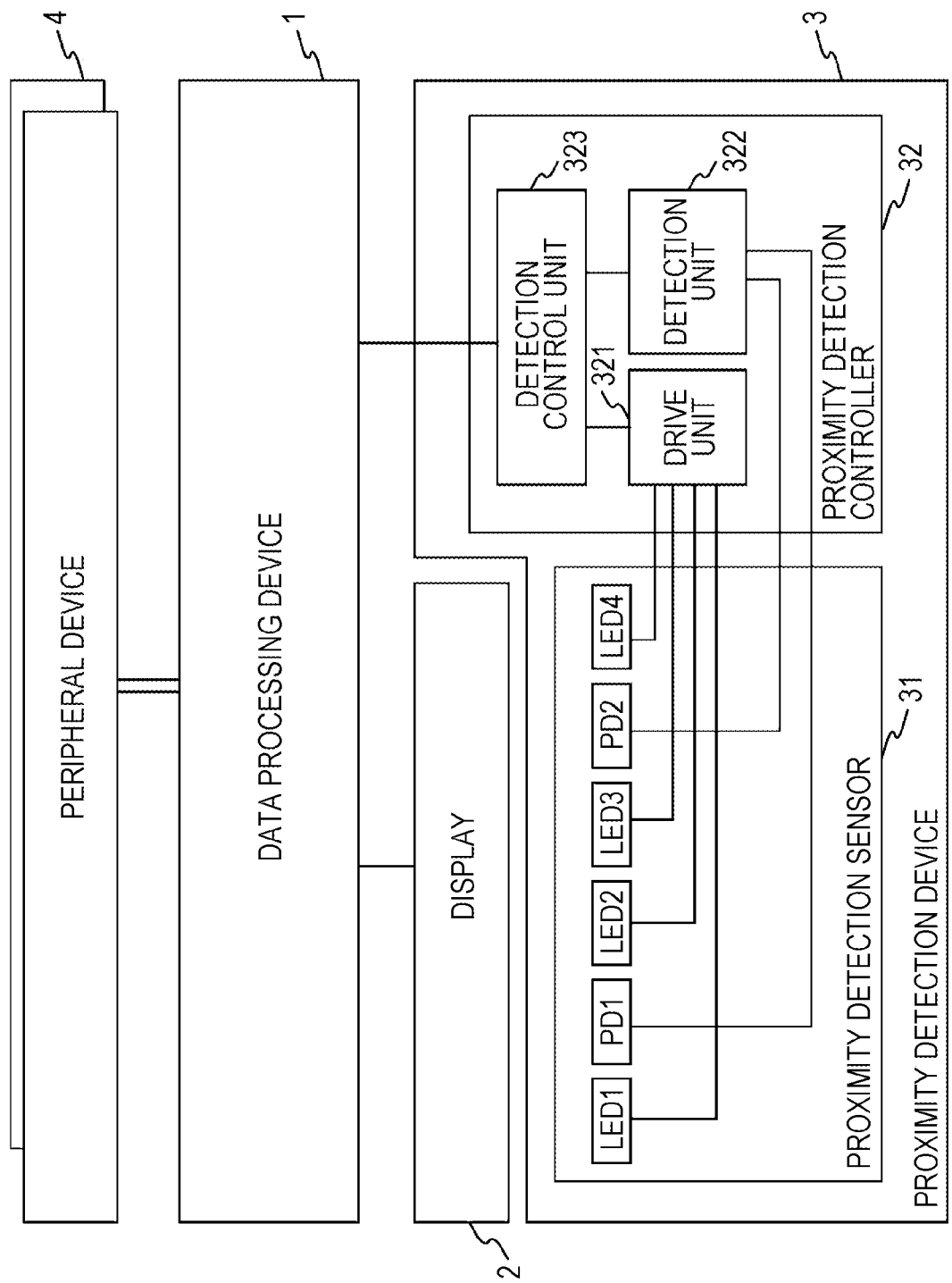
FIG. 1 is a block diagram illustrating a configuration of an information processing system according to a first embodiment of the present invention.

Hereinafter, embodiments of the present invention will be described. Next, a first embodiment will be described. FIG. 1 illustrates a configuration of an information processing system according to the first embodiment. The information processing system is a system installed in an automobile and includes: a data processing device 1 that executes a car navigation application, a media player application, and the like; a display 2 that is used by the data processing device 1 for image display; a proximity detection device 3; and other peripheral devices 4 used by the data processing device 1.

Figure 2:
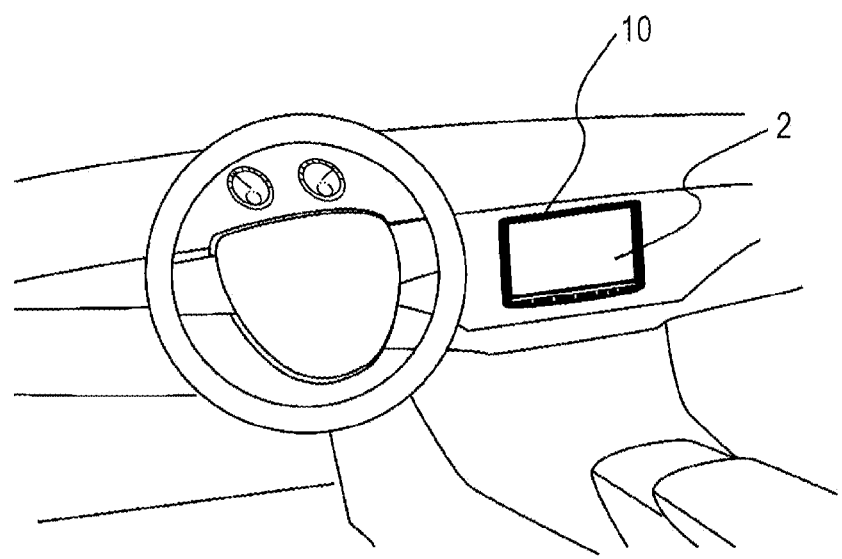
FIG. 2 is a view illustrating an arrangement of a display according to the first embodiment of the present invention.

As illustrated in FIG. 2, the display 2 and the proximity detection device 3 are arranged at a position between a driver's seat and a passenger's seat on a dashboard of the automobile with a display surface facing rearward in the form of an integrated display unit 10. Note that the illustrated example is a case where the automobile is a left-hand steering wheel automobile.

Returning to FIG. 1, the proximity detection device 3 includes a proximity detection sensor 31 and a proximity detection controller 32. The proximity detection sensor 31 includes four infrared LEDs, that is, an LED 1, an LED 2, an LED 3, and an LED 4, and two photodiodes, that is, a PD 1 and a PD 2, which detect infrared light. In addition, the proximity detection controller 32 includes: a drive unit 321 that drives the LED 1, the LED 2, the LED 3, and the LED 4 to emit light; a detection unit 322 that converts current signals output by the PD 1 and the PD 2 into intensity signals indicating intensities of infrared light incident to the PD 1 and the PD 2 and outputs the intensity signals; and a detection control unit 323 that controls operations of the drive unit 321 and the detection unit 322, detects an approach of a user's hand to a display surface of the display 2 according to the intensities of infrared light represented by the intensity signals output by the detection unit 322, and notifies the data processing device 1 of the detected approach.

Next, as illustrated in FIGS. 3A and 3B, the LED 1, the LED 2, the LED 3, and the LED 4 are arranged at approximately equal intervals from left to right in this order slightly below a lower side of the display 2 while defining the left-right direction, the up-down direction, and the front-rear direction with respect to the display 2. However, the front direction is a display direction of the display 2.

In addition, the PD 1 is arranged at a position in the middle between the LED 1 and the LED 2 and converts reflected light of incident infrared light into a current signal, and the PD 2 is arranged at a position in the middle between the LED 3 and the LED 4, converts reflected light of incident infrared light into a current signal, and outputs the current signal.

The arrows in FIGS. 3A and 3B represent central axes of directional angles of the LED 1, the LED 2, the LED 3, and the LED 4, and the LED 1, the LED 2, the LED 3, and the LED 4 emit infrared light obliquely to the front and upper side of the display 2.

FIG. 3C illustrates a range of a detection area, which is the area where the user's hand is detected in the first embodiment, as viewed in the up-down direction. Note that the hatched range in the drawing is the range of the detection area as viewed in the up-down direction.

As illustrated in FIG. 3C, the detection area is set such that a distance from the display surface to a forward boundary of the detection area is constant in a first range, which is approximately ⅓ of the range on the right side of the display surface in the left-right direction, and the distance from the display surface to the forward boundary of the detection area gradually decreases to the left side, which is a driver's seat side, in a range on the left side of the first range.

Figure 4:
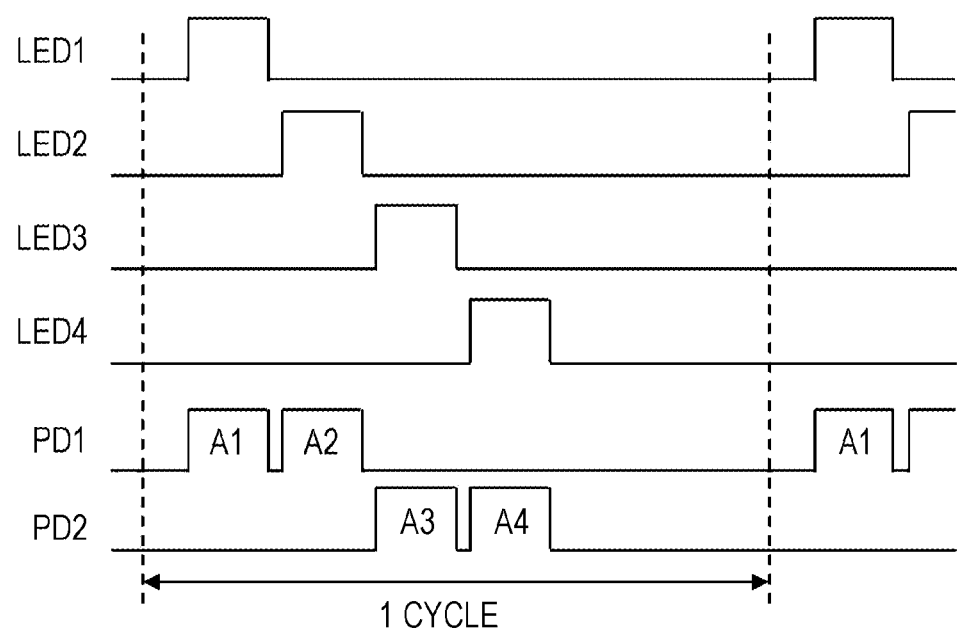
FIG. 4 is a view illustrating an operation sequence of the proximity detection sensor according to the first embodiment of the present invention.

The detection control unit 323 of the proximity detection controller 32 controls the operations of the drive unit 321 and the detection unit 322 such that each cycle illustrated in FIG. 4 is repeated. Here, each cycle includes a period in which the drive unit 321 drives only the LED 1 to emit light and the detection unit 322 outputs an intensity signal A1 indicating the intensity of infrared light incident on the PD 1, a period in which the drive unit 321 drives only the LED 2 to emit light and the detection unit 322 outputs an intensity signal A2 indicating the intensity of infrared light incident on the PD 1, a period in which the drive unit 321 drives only the LED 3 to emit light and the detection unit 322 outputs an intensity signal A3 indicating the intensity of infrared light incident on the PD 2, and a period in which the drive unit 321 drives only the LED 4 to emit light and the detection unit 322 outputs an intensity signal A4 indicating the intensity of infrared light incident on the PD 2.

Figure 5:
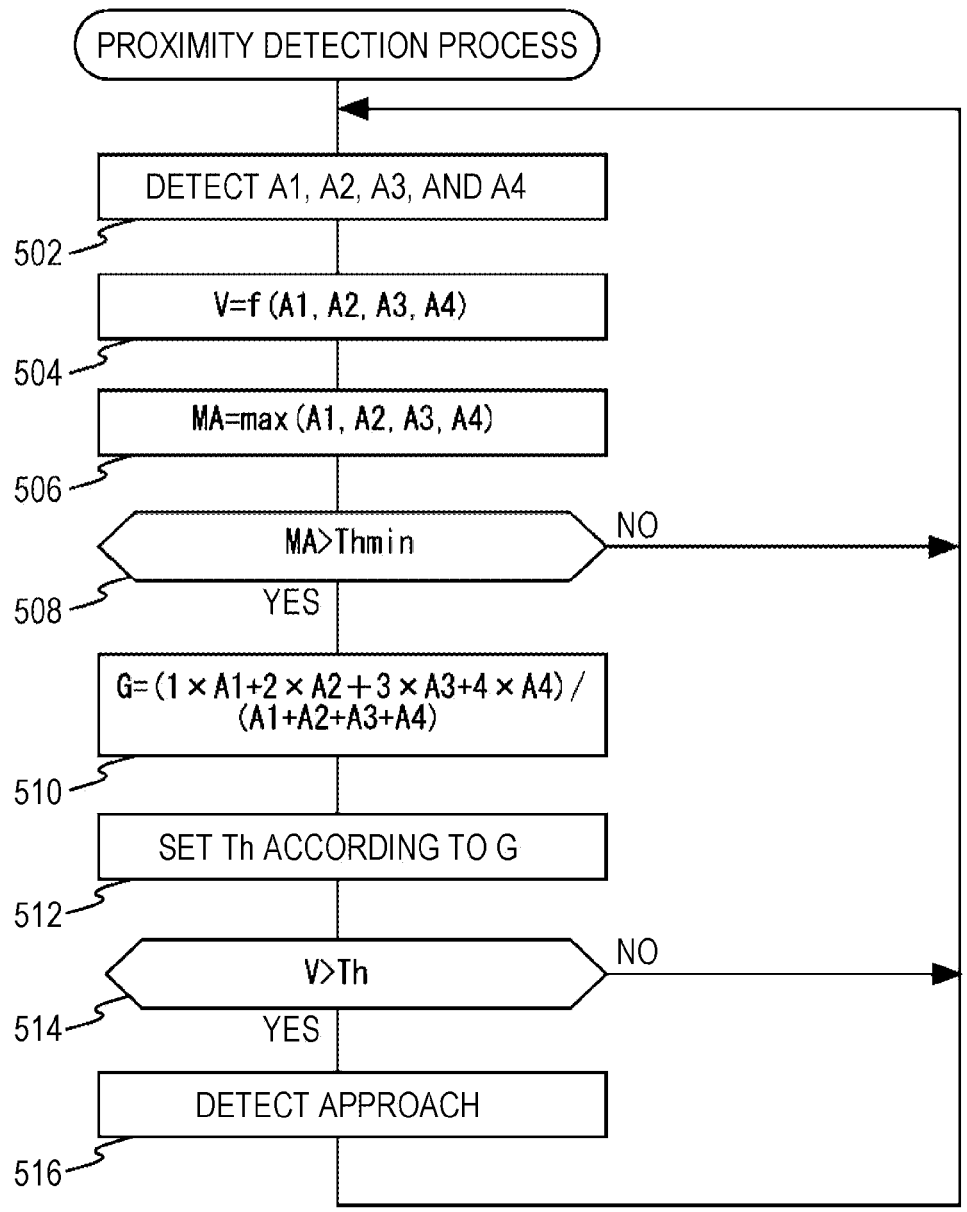
FIG. 5 is a flowchart illustrating a proximity detection process according to the first embodiment of the present invention.

Next, a proximity detection process performed by the detection control unit 323 of the proximity detection controller 32 will be described. FIG. 5 illustrates a procedure of this proximity detection process. As illustrated, if the intensity signals A1, A2, A3, and A4 are acquired from the detection unit 322 in each cycle illustrated in FIG. 4 (Step 502), the detection control unit 323 calculates an evaluation index V of the intensity signals A1, A2, A3, and A4 by V=f(A1, A2, A3, A4) using a predetermined evaluation function f( )(Step 504). The evaluation function f( ) is a function that calculates the magnitude of reflection by an object in the vicinity of the display surface in front of the display surface from the intensity signals A1, A2, A3, and A4. As an example, as the evaluation function f( ), a function that calculates the maximum value of the intensity signals A1, A2, A3, and A4, linear combination functions of A1, A2, A3, and A4 (a×A1+b×A2+c×A3+d×A4), or the like can be used.

In addition, the maximum value of the intensity signals A1, A2, A3, and A4 is calculated as MA (Step 506), and whether MA exceeds a predetermined threshold Thmin is examined (Step 508). As the threshold Thmin, for example, the minimum value with which MA can be taken when reflection by the user's hand occurs near the display surface in front of the display surface of the display 2 is used.

If MA does not exceed the threshold Thmin (NO in Step 508), the process returns to Step 502 directly, and waits for acquisition of the intensity signals A1, A2, A3, and A4 of the next cycle from the detection unit 322.

On the other hand, if MA exceeds the threshold Thmin, a center of gravity G is calculated by the following formula (Step 510).

$$G=(1\times A1+2\times A2+3\times A3+4\times A4)/(A1+A2+A3+A4)$$

Here, the center of gravity G represents a coordinate of a center of gravity of an intensity distribution of the infrared light LED, a coordinate value of the center of gravity when only A1 is detected and the other values are zero is represented by 1, a coordinate value of the center of gravity when only A4 is detected and the other values are zero is represented by 4, and an intermediate position therebetween is represented by a coordinate value between 1 and 4.

In addition, the center of gravity G represents an estimated value of a position in the left-right direction in which reflection by the user's hand occurs in front of the display surface as a value from 1 to 4, takes a larger value as the estimated position is closer to the right side, and takes a smaller value as the position is closer to the left side.

Next, a threshold Th is set to a value corresponding to the center of gravity G (Step 512). Next, V calculated in Step 504 is compared with the threshold Th (Step 514). If the evaluation index V is not larger than the threshold Th, the process returns to Step 502 directly, and waits for the acquisition of the intensity signals A1, A2, A3, and A4 of the next cycle from the detection unit 322.

On the other hand, if the evaluation index V is larger than the threshold Th, the approach of the user's hand to the display surface of the display 2 is detected, and the data processing device 1 is notified of the approach of the user's hand (Step 516).

Then, the process returns to Step 502 and waits for acquisition of the intensity signals A1, A2, A3, and A4 of the next cycle from the detection unit 322.

Here, in Step 512, the threshold Th is set to a value corresponding to a value of the center of gravity G indicating a position in the left-right direction where the reflection by the user's hand has occurred such that the range viewed in the up-down direction of the detection area, which is the area where the approach of the user's hand is detected in Steps 514 and 516, becomes the range illustrated in FIG. 3C.

Figure 6:
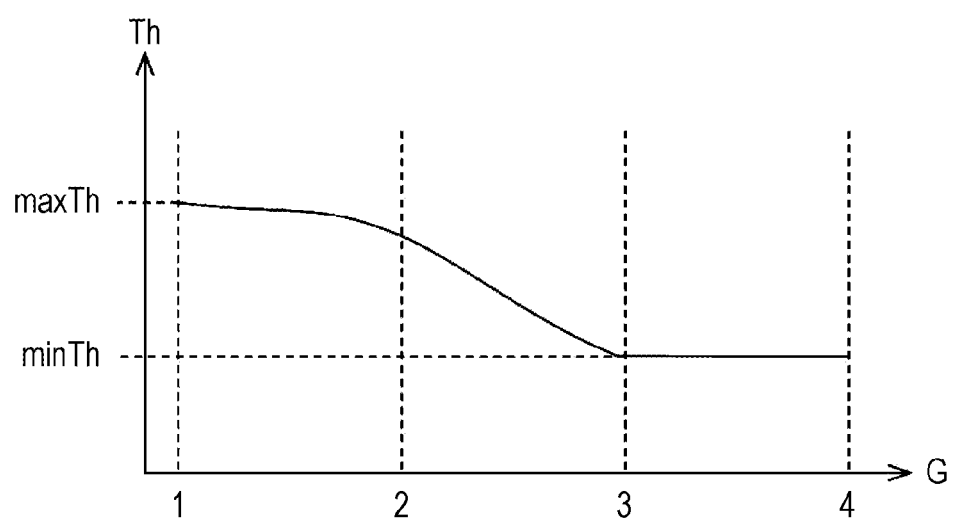
FIG. 6 is a view illustrating a threshold according to the first embodiment of the present invention.

That is, in Step 512, the threshold Th is set according to a relationship between the center of gravity G and the threshold Th illustrated in FIG. 6, for example. In the relationship illustrated in FIG. 6, Th gradually increases from minTh to maxTh as the center of gravity G increases from 1 to approximately 3, and Th becomes a constant value maxTh in a range where the center of gravity G is approximately 3 to 4. Note that the relationship between the center of gravity G and the threshold Th may be set in the detection control unit 323 as a mathematical formula or may be set in the detection control unit 323 as a table.

The proximity detection process performed by the detection control unit 323 has been described above. As described above, according to the first embodiment, the distance from the display surface to the forward boundary of the detection area, which is the area where the approach of the user's hand is detected, that is, the sensitivity for detection of the approach of the user's hand can be arbitrarily set for each position in the left-right direction on the display surface only using the four infrared LEDs and the two photodiodes used to detect the approach of the user's hand to the display surface.

Then, a detection area having a small distance from the display surface to the forward boundary of the detection area on the left side, which is the driver's seat side, is set as the detection area as illustrated in FIG. 3C, and the sensitivity on the left side, which is the driver's seat side, is set to be low. Thus, it is possible to suppress the erroneous detection of an operation on another device as the approach of the user's hand to the display surface of the display without using the dedicated infrared LED that emits infrared light from the display toward the driver's seat.

In addition, it is possible to set the detection area in which the distance from the display surface to the forward boundary changes gently as illustrated in FIG. 3C according to the first embodiment. Therefore, as in a case where a detection area as illustrated in FIG. 3D is provided by setting different thresholds Th for each of the intensity signals A1, A2, A3, and A4, it is also possible to suppress repetition of detection and non-detection of the approach regarding the motion of the user's hand indicated by the arrow in the drawing. Hereinafter, a second embodiment of the present invention will be described.

In the first embodiment described above, the LED 1, the LED 2, the LED 3, and the LED 4 are provided below the display surface, and thus, the illumination intensity of infrared light is smaller in an area above the display surface where the distance to the LED 1, the LED 2, the LED 3, and the LED 4 is larger than in an area below the display surface. Therefore, similar to the first embodiment, when the threshold Th is set depending only on the center of gravity G such that the detection area in front of an area below the display surface matches the detection area illustrated in FIG. 3C, there is a case where it is difficult to normally detect the user's hand in an area A_E1 of FIGS. 7A and 7B, which is the area on the left side of the display surface where a relatively large threshold Th is set and on the upper side where an illumination intensity of infrared light is small.

The second embodiment solves such a problem, and is different from the first embodiment described above in terms of only a cycle in which the detection control unit 323 of the proximity detection controller 32 causes the drive unit 321 and the detection unit 322 to operate and a proximity detection process performed by the detection control unit 323. In the second embodiment, the detection control unit 323 of the proximity detection controller 32 controls operations of the drive unit 321 and the detection unit 322 such that each cycle illustrated in FIG. 8A is repeated.

Here, each cycle includes a period in which the drive unit 321 drives only the LED 1 to emit light and the detection unit 322 outputs the intensity signal A1 indicating the intensity of infrared light incident on the PD 1 and an intensity signal E1 indicating the intensity of infrared light incident on the PD 2, a period in which the drive unit 321 drives only the LED 2 to emit light and the detection unit 322 outputs the intensity signal A2 indicating the intensity of infrared light incident on the PD 1, a period in which the drive unit 321 drives only the LED 3 to emit light and the detection unit 322 outputs the intensity signal A3 indicating the intensity of infrared light incident on the PD 2, and a period in which the drive unit 321 drives only the LED 4 to emit light and the detection unit 322 outputs the intensity signal A4 indicating the intensity of infrared light incident on the PD 2.

Figure 8A:
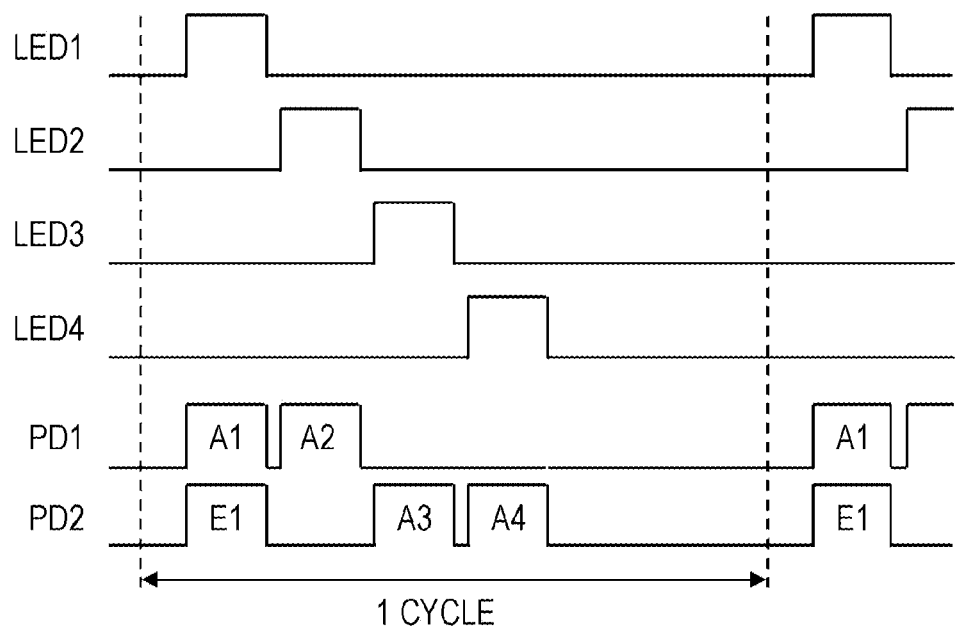
FIGS. 8A and 8B are views illustrating operation sequences of the proximity detection sensor according to the second embodiment of the present invention.
Figure 8B:
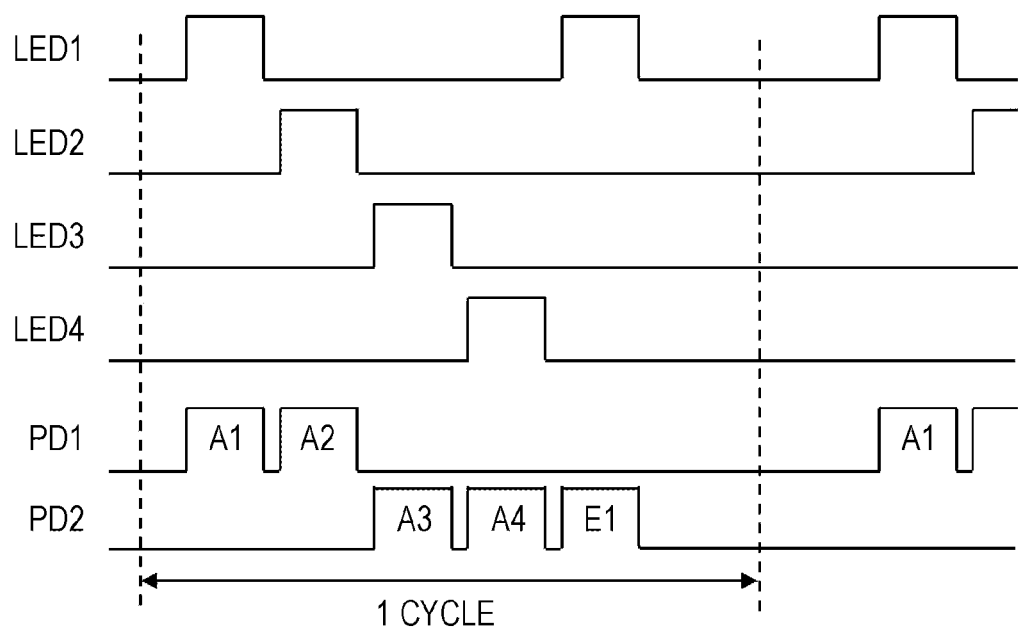

However, the detection control unit 323 of the proximity detection controller 32 may control the operations of the drive unit 321 and the detection unit 322 such that a cycle illustrated in FIG. 8B is repeatedly performed instead of the cycle illustrated in FIG. 8A.

The cycle illustrated in FIG. 8B includes a period in which the drive unit 321 drives only the LED 1 to emit light and the detection unit 322 outputs the intensity signal A1 indicating the intensity of infrared light incident on the PD 1, a period in which the drive unit 321 drives only the LED 2 to emit light and the detection unit 322 outputs the intensity signal A2 indicating the intensity of infrared light incident on the PD 1, a period in which the drive unit 321 drives only the LED 3 to emit light and the detection unit 322 outputs the intensity signal A3 indicating the intensity of infrared light incident on the PD 2, a period in which the drive unit 321 drives only the LED 4 to emit light and the detection unit 322 outputs the intensity signal A4 indicating the intensity of infrared light incident on the PD 2, and a period in which the drive unit 321 drives only the LED 1 to emit light and the detection unit 322 outputs the intensity signal E1 indicating the intensity of infrared light incident on the PD 2.

Figure 7B:
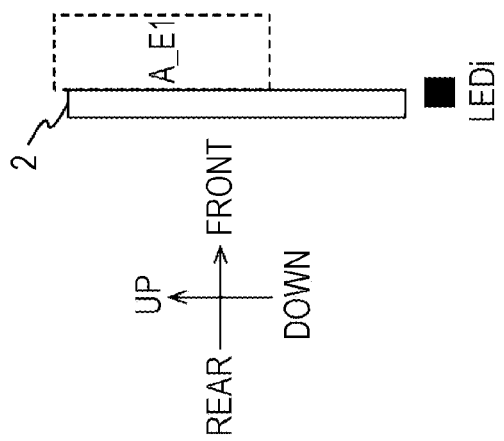
FIGS. 7A and 7B are views illustrating an arrangement of a proximity detection sensor according to a second embodiment of the present invention.
Figure 7A:
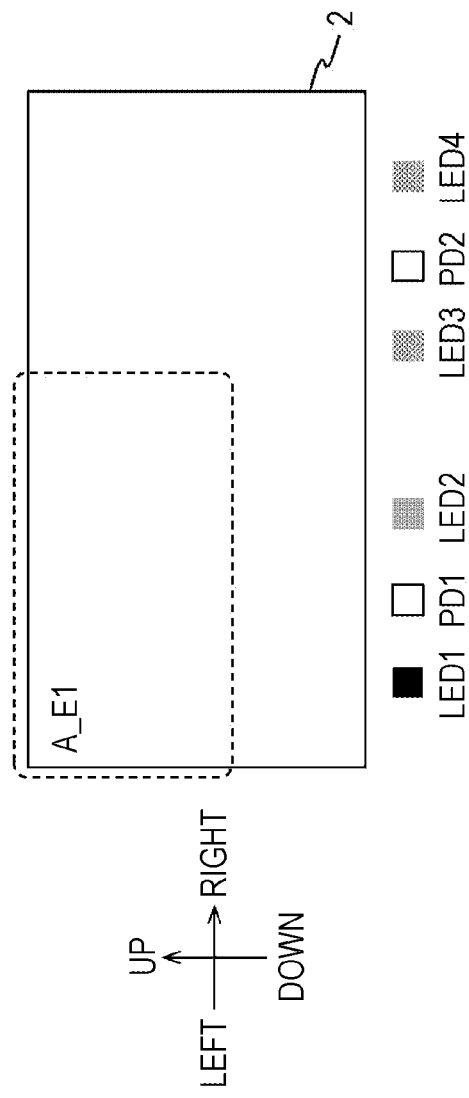

In cycles illustrated in FIGS. 8A and 8B, the intensity signal E1 representing the intensity of infrared light incident on the PD 2 when only the LED 1 emits light has a larger value when reflection by the user's hand occurs in the approximately upper left area A_E1 of the display 2 illustrated in FIGS. 7A and 7B as compared with a case where reflection occurs in the other area.

Figure 9A:
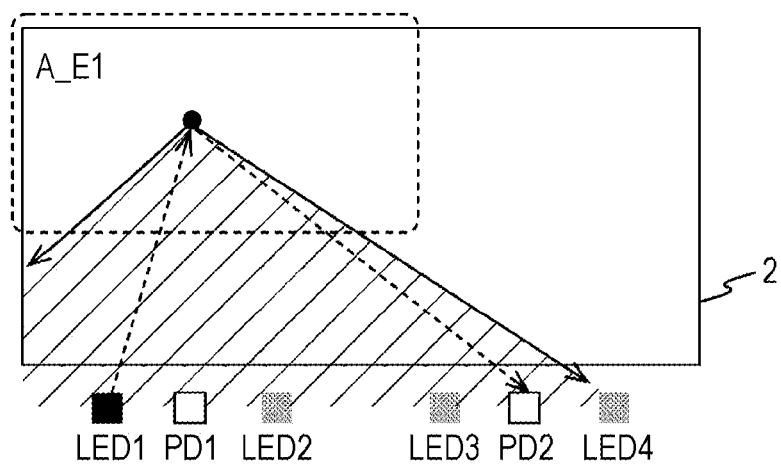
FIGS. 9A and 9B are views illustrating a principle of area detection of the proximity detection sensor according to the second embodiment of the present invention.
Figure 9B:
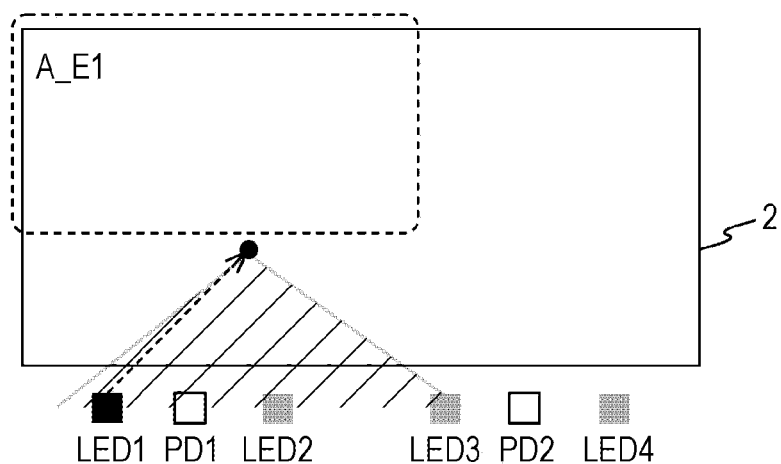

This is because the approximately upper left area A_E1 of the display 2 is irradiated with the infrared light emitted by the LED 1, and a positional relationship among the LED 1, the PD 2, and area A_E1 is a positional relationship where reflected light of infrared light emitted by the LED 1, generated by reflection occurring in the area A_E1, reaches the PD 2 as illustrated in FIG. 9A, but the other area is hardly irradiated with the infrared light emitted by the LED 1 or is an area where a positional relationship between the LED 1 and the PD 2 is a positional relationship where reflected light of infrared light emitted by the LED 1, generated by reflection occurring in the area, hardly reaches the PD 2 as illustrated in FIG. 9B.

Figure 10:
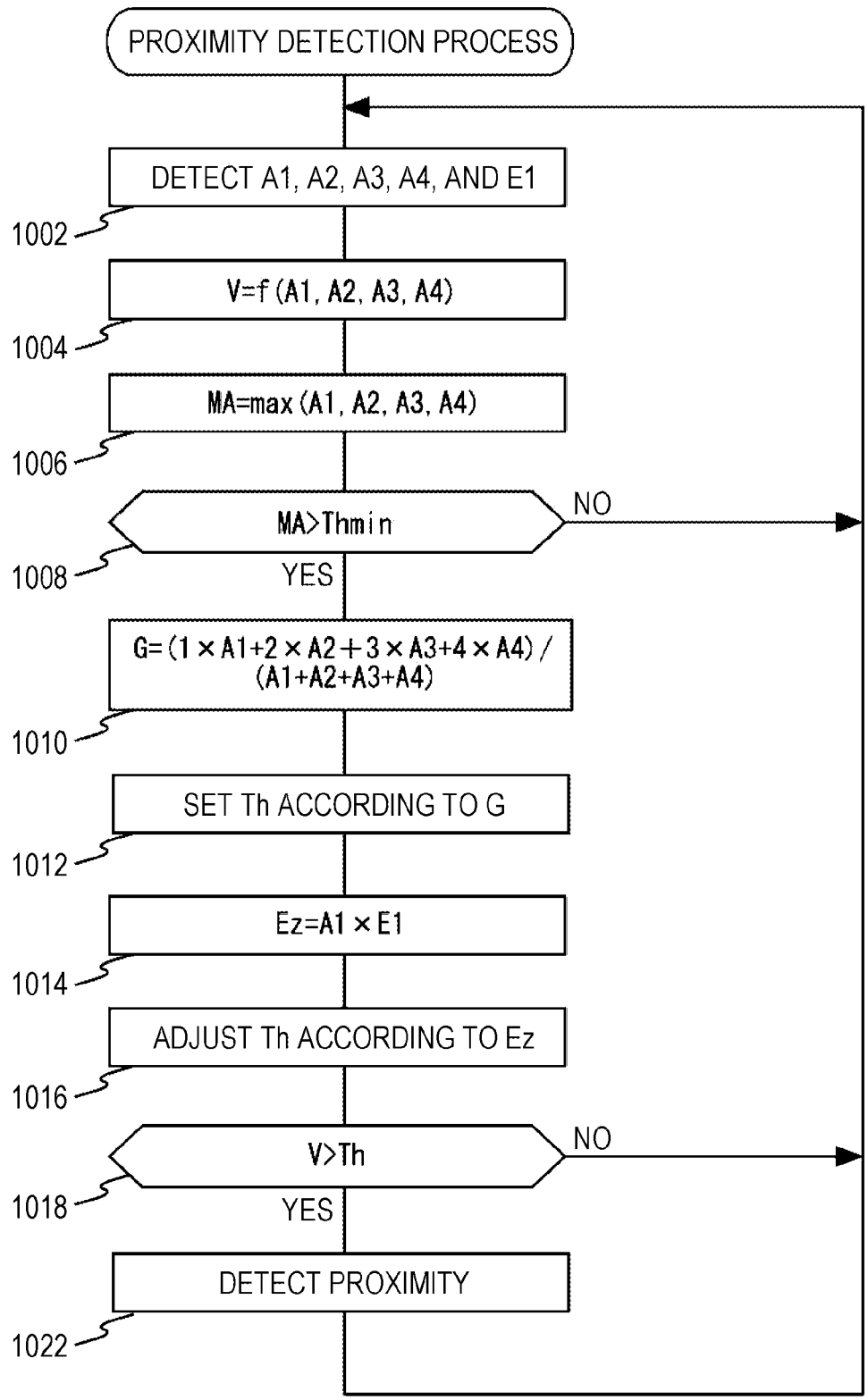
FIG. 10 is a flowchart illustrating a proximity detection process according to the second embodiment of the present invention.

Next, FIG. 10 illustrates a procedure of proximity detection process performed by the detection control unit 323 of the proximity detection controller 32 in the second embodiment. As illustrated, in the second embodiment, if the intensity signals A1, A2, A3, A4, and E1 are acquired from the detection unit 322 in each cycle illustrated in FIG. 4 (Step 1002), the detection control unit 323 calculates an evaluation index V of the intensity signals A1, A2, A3, and A4 by V=f(A1, A2, A3, A4) using a predetermined evaluation function f( ) (Step 1004). The evaluation function f( ) is a function that calculates the magnitude of reflection by an object in the vicinity of the display surface in front of the display surface from the intensity signals A1, A2, A3, and A4. As an example, as the evaluation function f( ), a function that calculates the maximum value of the intensity signals A1, A2, A3, and A4, linear combination functions of A1, A2, A3, and A4 (a×A1+b×A2+c×A3+d×A4), or the like can be used.

In addition, the maximum value of the intensity signals A1, A2, A3, and A4 is calculated as MA (Step 1006), and whether MA exceeds the predetermined threshold Thmin is examined (Step 1008). If MA does not exceed the threshold Thmin, the process returns to Step 1002 directly, and waits for acquisition of the intensity signals A1, A2, A3, A4, and E1 of the next cycle from the detection unit 322.

On the other hand, if MA exceeds the threshold Thmin, the center of gravity G is calculated by the following formula similar to the first embodiment (Step 1010).

$$G=(1 \times A1+2 \times A2+3 \times A3+4 \times A4)/(A1+A2+A3+A4)$$

In addition, the threshold Th is set to a value corresponding to the center of gravity G similar to the first embodiment (Step 1012).

Next, Ez is calculated by Ez=A1×E1 (Step 1014), and the threshold Th is adjusted according to a value of Ez (Step 1016). In Step 1016, the threshold Th is adjusted such that the threshold Th is smaller in a case where the Ez is large than in a case where the Ez is small. More specifically, assuming that n is a predetermined positive integer, and the threshold Th is reduced by n % when Ez is larger than a predetermined value set in advance, and the threshold Th is not changed when Ez is not larger than the predetermined value. Alternatively, the threshold Th is adjusted by increasing or decreasing the threshold Th so as to decrease as Ez increases.

Next, V calculated in Step 1004 is compared with the adjusted threshold Th (Step 1018). If the evaluation index V is not larger than the threshold Th, the process returns to Step 1002 directly, and waits for the acquisition of the intensity signals A1, A2, A3, A4, and E1 of the next cycle from the detection unit 322.

On the other hand, if the evaluation index V is larger than the threshold Th, the approach of the user's hand to the display surface of the display 2 is detected, and the data processing device 1 is notified of the approach of the user's hand (Step 1022).

Then, the process returns to Step 1002 and waits for acquisition of the intensity signals A1, A2, A3, A4, and E1 of the next cycle from the detection unit 322. Here, A1 has a relatively large value when the reflection by the user's hand occurs in the left area of the display 2. In addition, as described above, E1 has a relatively large value when the reflection by the user's hand occurs in the upper left area of the display 2, and has a relatively small value when there is no reflection by the user's hand in the upper left area of the display 2.

Therefore, when both A1 and E1 are larger than a predetermined level and the product of A1 and E1 is large, that is, when the Ez calculated in Step 1014 is large, it can be determined that the reflection by the user's hand occurs at a position within the upper left area of the display 2.

Then, the threshold Th is adjusted such that the threshold Th decreases when Ez is large in Step 1016 so that the user's hand within the upper left area A_E1 illustrated in FIGS. 7A and 7B can be detected using the threshold Th smaller than that of a lower left area in Steps 1018 and 1022.

Therefore, similar to the first embodiment, when the threshold Th is set depending only on the center of gravity G such that the detection area in front of an area below the display surface matches the detection area illustrated in FIG. 3C, it is possible to normally detect the user's hand even in the upper left area A_E1 located on the left side of the display surface where the relatively large threshold Th is set and on the upper side where the illumination intensity of infrared light is small according to the second embodiment.

The second embodiment of the present invention has been described as above. Note that A1×E1 is used as Ez in the proximity detection process of the second embodiment described above, but other values may be used as Ez as long as a signal can roughly determine an area that needs to be compensated for weakening of the detection of the upper part on the driver's seat side in the first embodiment.

Figure 11:
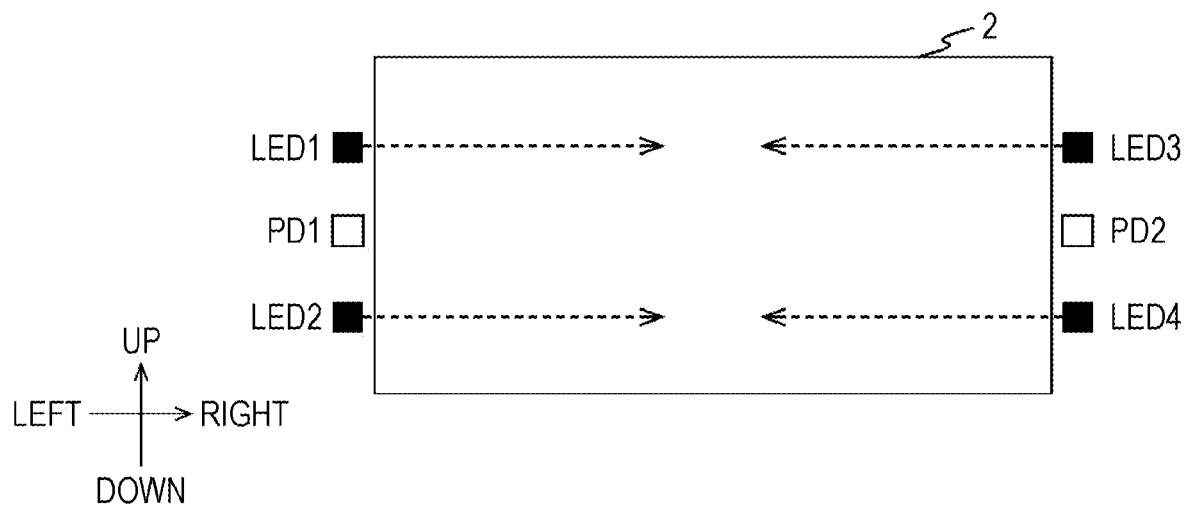
FIG. 11 is a view illustrating an arrangement of a proximity detection sensor according to a third embodiment of the present invention.

Hereinafter, a third embodiment of the present invention will be described. The third embodiment differs from the above-described first embodiment only in terms of an arrangement of the LED 1, the LED 2, the LED 3, the LED 4, the PD 1 and the PD 2, and a proximity detection process performed by the detection control unit 323. That is, in the third embodiment, as illustrated in FIG. 11, the LED 1, the PD 1 and the LED 2 are arranged from top to bottom in the described order slightly at the left of a left side of the display surface of the display 2, and the LED 3, the PD 2, and the LED 4 are arranged from top to bottom in the described order slightly at the right of a right side of the display surface of the display 2.

Figure 12:
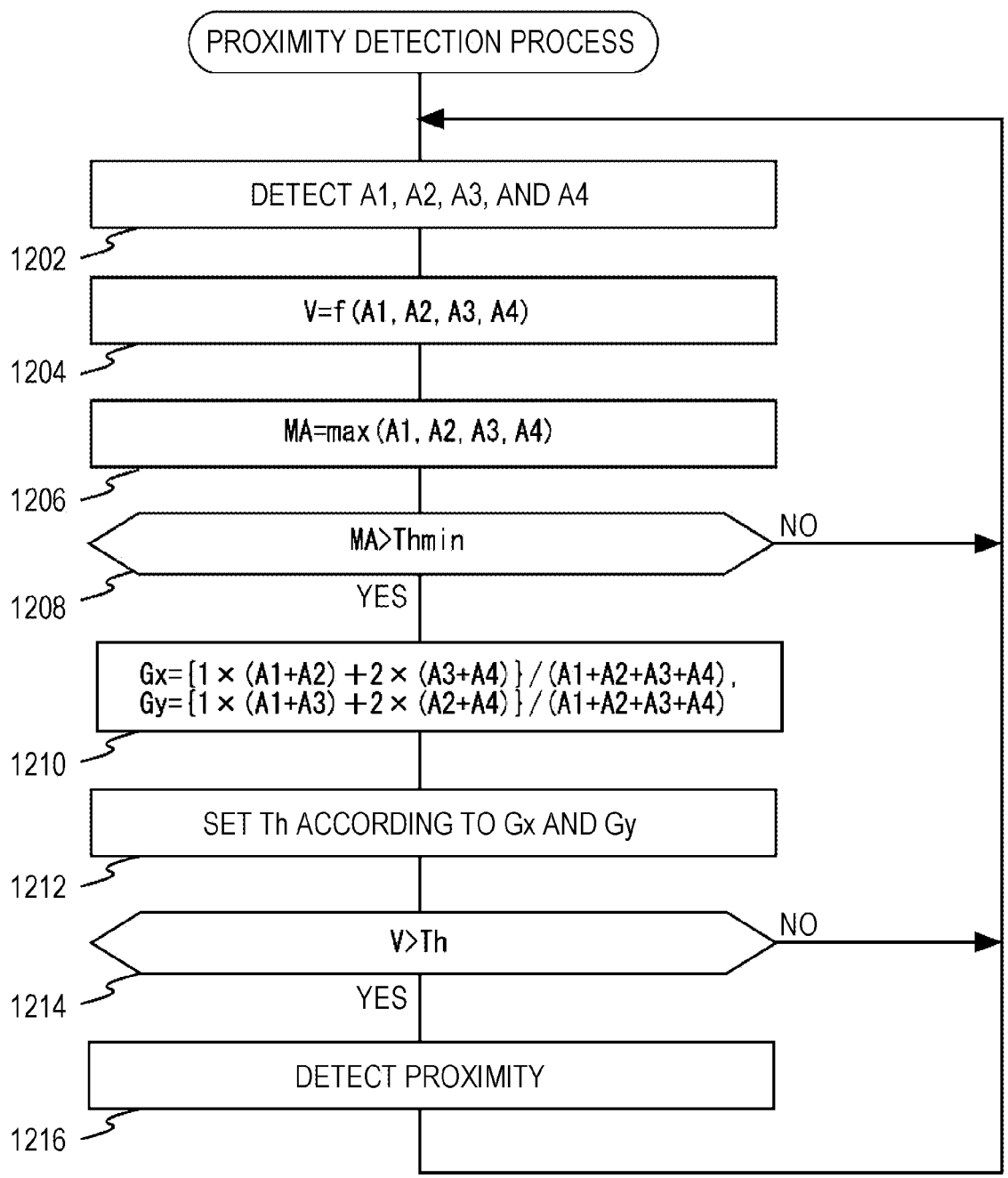
FIG. 12 is a flowchart illustrating a proximity detection process according to the third embodiment of the present invention.
Figure 13:
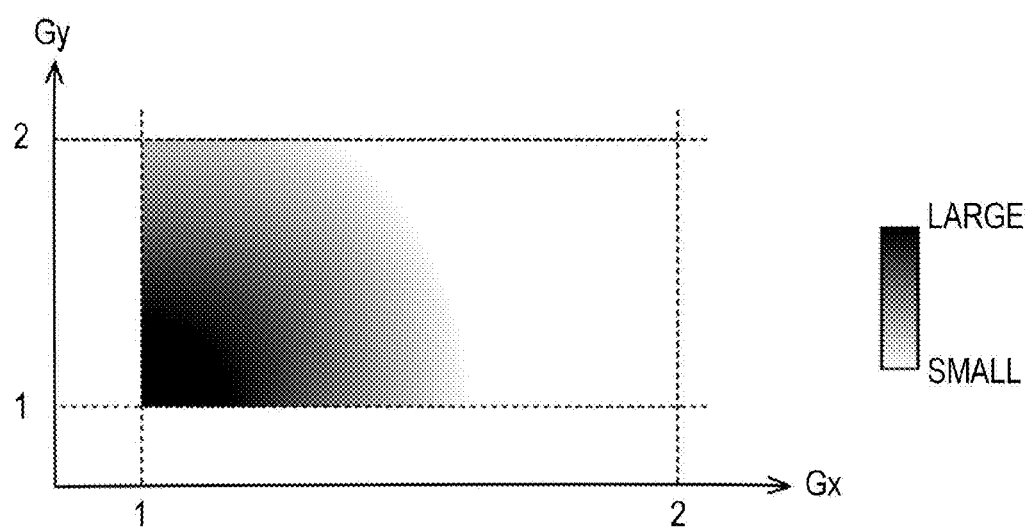
FIG. 13 is a view illustrating a threshold according to the third embodiment of the present invention.

In addition, the detection control unit 323 performs the proximity detection process illustrated in FIG. 12. As illustrated, in this proximity detection process, if the intensity signals A1, A2, A3, and A4 are acquired from the detection unit 322 in each cycle illustrated in FIG. 4 (Step 1202), the evaluation index V of the intensity signals A1, A2, A3, and A4 is calculated by V=f(A1, A2, A3, A4) using a predetermined evaluation function f( ) (Step 1204), and the maximum value of the intensity signals A1, A2, A3, and A4 is calculated as MA (Step 1206). The evaluation function f( ) is a function that calculates the magnitude of reflection by an object in the vicinity of the display surface in front of the display surface from the intensity signals A1, A2, A3, and A4. As an example, as the evaluation function f( ), a function that calculates the maximum value of the intensity signals A1, A2, A3, and A4, linear combination functions of A1, A2, A3, and A4 (a×A1+b×A2+c×A3+d×A4), or the like can be also used. Then, whether the MA exceeds the threshold Thmin is examined (Step 1208), and the process returns to Step 1202 directly if MA does not exceed the threshold Thmin, and waits for acquisition of the intensity signals A1, A2, A3, and A4 of the next cycle from the detection unit 322.

On the other hand, if MA exceeds the threshold Thmin, centers of gravity Gx and Gy are calculated by the following formula (Step 1210).

$$Gx=\{1\times(A1+A2)+2\times(A3+A4)\}/(A1+A2+A3+A4),$$

$$Gy=\{1\times(A1+A3)+2\times(A2+A4)\}/(A1+A2+A3+A4)$$

Here, to the intensity signals A1, A2, A3, and A4, ordered elements of an array in the left-right direction of infrared light LEDs having emitted beams of infrared light reflected as beams of reflected light whose intensities are represented by intensity signals are assigned as x-coordinates of the intensity signals, and ordered elements of an array in the up-down direction of infrared light LEDs having emitted beams of infrared light reflected as beams of reflected light whose intensities are represented by intensity signals are assigned as y-coordinates of the intensity signals.

Here, the x-coordinate 1 is assigned to the intensity signals A1 and A2 of reflected light of infrared light of the LED 1 and the LED 2 at the first from the left, the x-coordinate 2 is assigned to the intensity signals A3 and A4 of reflected light of infrared light of the LED 3 and the LED 4 at the second from the left, the y-coordinate 1 is assigned to the intensity signals A1 and A3 of reflected light of infrared light of the LED 1 and the LED 3 at the first from the top, and the y-coordinate 2 is assigned to the intensity signals A2 and A4 of reflected light of infrared light of the LED 2 and the LED 4 at the second from the top.

Then, the center of gravity Gx represents the x-coordinate of the center of gravity of the intensity distribution, and the center of gravity Gy represents the y-coordinate of the center of gravity of the intensity distribution. In addition, the center of gravity Gx represents an estimated value of a position in the left-right direction in which reflection by the user's hand occurs in front of the display surface as a value from 1 to 2, takes a larger value as the estimated position is closer to the right side, and takes a smaller value as the position is closer to the left side. In addition, the center of gravity Gy represents an estimated value of a position in the up-down direction in which reflection by the user's hand occurs in front of the display surface as a value from 1 to 2, takes a larger value as the estimated position is closer to the lower side, and takes a smaller value as the position is closer to the upper side.

Next, the threshold Th is set to a value corresponding to the center of gravity Gx in the left-right direction and the center of gravity Gy in the up-down direction (Step 1212). Then, V calculated in Step 1204 is compared with the threshold Th (Step 1214). If the evaluation index V is not larger than the threshold Th, the process returns to Step 1202 directly, and waits for the acquisition of the intensity signals A1, A2, A3, and A4 of the next cycle from the detection unit 322.

On the other hand, if the evaluation index V is larger than the threshold Th, the approach of the user's hand to the display surface of the display 2 is detected, and the data processing device 1 is notified of the approach of the user's hand (Step 1216).

Then, the process returns to Step 1202 and waits for acquisition of the intensity signals A1, A2, A3, and A4 of the next cycle from the detection unit 322. Here, in Step 1212, he threshold Th is set according to the center of gravity Gx in the left-right direction indicating the position in the left-right direction where the reflection by the user's hand occurs and the center of gravity Gy in the up-down direction indicating the position in the up-down direction where the reflection by the user's hand occurs such that a forward boundary of a detection area, which is an area in front of the display surface where the approach of the user's hand is detected in Steps 1214 and 1216, has a required shape, that is, a distance from each position on the display surface to the forward boundary of the detection area is a distance that obtains matching with the required shape of the forward boundary of the detection area.

For example, in Step 1212, if the threshold Th is set according to the relationship among the center of gravity Gx in the left-right direction, the center of gravity Gy in the up-down direction, and the threshold Th illustrated in FIG.

13, it is possible to form the detection area in which the distance from the display surface to the forward boundary increases from the lower left to the upper right.

As described above, according to the third embodiment, the distance from the display surface to the forward boundary of the detection area, which is the area where the approach of the user's hand is detected, that is, the sensitivity for detection of the approach of the user's hand can be arbitrarily set for each position in the left-right and up-down directions on the display surface only using the four infrared LEDs and the two photodiodes used to detect the approach of the user's hand to the display surface.

The third embodiment of the present invention has been described as above. Note that the maximum value of the intensity signals A1, A2, A3, and A4 is used as the evaluation index MA in the proximity detection processes of the first embodiment, the second embodiment, and the third embodiment described above, but other values may be used as the evaluation index V as long as the values represent the degree of the magnitude of the reflected light detected in the PD 1 and the PD 2.

In addition, the four infrared LEDs of the LED 1, the LED 2, the LED 3, and the LED 4 and the two photodiodes of the PD 1 and the PD 2 are used in the first embodiment, the second embodiment, and the third embodiment described above, but the number of infrared LEDs may be a number other than four, and the number of photodiodes may be a number other than two.

While there has been illustrated and described what is at present contemplated to be preferred embodiments of the present invention, it will be understood by those skilled in the art that various changes and modifications may be made, and equivalents may be substituted for elements thereof without departing from the true scope of the invention. In addition, many modifications may be made to adapt a particular situation to the teachings of the invention without departing from the central scope thereof. Therefore, it is intended that this invention not be limited to the particular embodiments disclosed, but that the invention will include all embodiments falling within the scope of the appended claims.

What is claimed is:

1. A proximity detection device, which detects a user's approach to a display surface of a display, comprising:
   a plurality of infrared light sources that are arrayed along a first side, which is one side of the display surface, outside the display surface of the display and emit infrared light passing a front of the display surface;
   one or a plurality of light detectors that are arranged outside the display surface;
   a proximity detection unit that detects the user's approach to the display surface with a set sensitivity using an intensity of reflected light of the infrared light emitted by each of the infrared light sources detected by the light detector; and
   a sensitivity setting unit that estimates a first-direction position, which is a position where reflection occurs in a first direction which is a direction along the first side, according to the intensity of the reflected light of the infrared light emitted by each of the infrared light sources detected by the light detector and sets the sensitivity of the proximity detection unit to a sensitivity determined according to the estimated first-direction position and a preset relationship between the first-direction position and the sensitivity.

2. The proximity detection device according to claim 1, wherein
   the sensitivity setting unit calculates a center of gravity of an intensity distribution of the reflected light of the infrared light detected by the light detector as a value indicating the first-direction position.

3. The proximity detection device according to claim 2, wherein
   the display is arranged at a position between a driver's seat and a passenger's seat in a left-right direction of an automobile,
   the first direction coincides with the left-right direction of the automobile, and
   the preset relationship between the first-direction position and the sensitivity is a relationship where the sensitivity is lower in a case where the first-direction position is a position within an area close to the driver's seat of the display surface than in a case where the first-direction position is a position within an area close to the passenger's seat of the display surface.

4. The proximity detection device according to claim 3, wherein
   the proximity detection unit detects the user's approach to the display surface when a maximum value of the intensity of the reflected light of the infrared light emitted by the infrared light source, detected by the light detector for each of the plurality of infrared light sources, exceeds a set threshold,
   the relationship between the first-direction position and the sensitivity is defined as a relationship between the first-direction position and the threshold, and
   the sensitivity setting unit sets the threshold of the proximity detection unit to a threshold determined according to the estimated first-direction position and a preset relationship between the first-direction position and the threshold.

5. The proximity detection device according to claim 3, further comprising
   a plurality of light detectors that are arrayed along the first side as the light detector,
   wherein the proximity detection unit detects the user's approach to the display surface when an intensity of reflected light of the infrared light, represented by a first detected reflection intensity of emitted light of each of the infrared light sources, exceeds a set threshold using the intensity of the reflected light of the infrared light emitted by the infrared light source, detected by the light detector at a position relatively close to the infrared light source having emitted the infrared light, as the first detected reflection intensity of the emitted light of the infrared light source, for each of the plurality of infrared light sources,
   the relationship between the first-direction position and the sensitivity is defined as a relationship between the first-direction position and the threshold, and
   the sensitivity setting unit
   sets the threshold of the proximity detection unit to a threshold determined according to the estimated first-direction position and a preset relationship between the first-direction position and the threshold, and
   sets the threshold of the proximity detection unit to a threshold obtained by adjusting the threshold to a smaller threshold, instead of the threshold determined according to the relationship when both an intensity of reflected light of infrared light emitted by an infrared light source near a driver's seat, detected by a light detector relatively far from the infrared light source near the driver's seat, and the first detected reflection intensity of the infrared light source near the driver's seat are larger than a predetermined level.

6. The proximity detection device according to claim 2, wherein the proximity detection unit detects the user's approach to the display surface when a maximum value of the intensity of the reflected light of the infrared light emitted by the infrared light source, detected by the light detector for each of the plurality of infrared light sources, exceeds a set threshold, the relationship between the first-direction position and the sensitivity is defined as a relationship between the first-direction position and the threshold, and the sensitivity setting unit sets the threshold of the proximity detection unit to a threshold determined according to the estimated first-direction position and a preset relationship between the first-direction position and the threshold.

7. The proximity detection device according to claim 1, wherein the display is arranged at a position between a driver's seat and a passenger's seat in a left-right direction of an automobile, the first direction coincides with the left-right direction of the automobile, and the preset relationship between the first-direction position and the sensitivity is a relationship where the sensitivity is lower in a case where the first-direction position is a position within an area close to the driver's seat of the display surface than in a case where the first-direction position is a position within an area close to the passenger's seat of the display surface.

8. The proximity detection device according to claim 7, wherein the proximity detection unit detects the user's approach to the display surface when a maximum value of the intensity of the reflected light of the infrared light emitted by the infrared light source, detected by the light detector for each of the plurality of infrared light sources, exceeds a set threshold, the relationship between the first-direction position and the sensitivity is defined as a relationship between the first-direction position and the threshold, and the sensitivity setting unit sets the threshold of the proximity detection unit to a threshold determined according to the estimated first-direction position and a preset relationship between the first-direction position and the threshold.

9. A proximity detection device, which detects a user's approach to a display surface of a display, comprising:

a plurality of infrared light sources that are arrayed along a first side, which is one side of the display surface, outside the display surface of the display and emit infrared light passing the front of the display surface;

a plurality of infrared light sources that are arrayed along a second side of the display surface, which is a side opposing the first side, outside the display surface and emit infrared light passing the front of the display surface;

one or a plurality of light detectors arranged outside the display surface;

a proximity detection unit that detects the user's approach to the display surface with a set sensitivity using an intensity of reflected light of the infrared light emitted by each of the infrared light sources detected by the light detector; and a sensitivity setting unit that estimates a first-direction position, which is a position where reflection in a first direction occurs, according to intensities of beams of reflected light of infrared light emitted by a plurality of infrared light sources having different positions in the first direction, which is a direction along the first side, detected by the light detector, estimates a second-direction position, which is a position where reflection in a second direction occurs, according to intensities of beams of reflected light of infrared light emitted by a plurality of infrared light sources having different positions in the second direction, which is a direction along a side perpendicular to the first side, detected by the light detector, and sets the sensitivity of the proximity detection unit to a sensitivity determined according to the estimated first-direction position and second-direction position and a preset relationship among the first-direction position, the second-direction position, and the sensitivity.

10. The proximity detection device according to claim 9, wherein the sensitivity setting unit calculates a center of gravity of an intensity distribution, obtained using coordinates of the intensities of beams of reflected light of infrared light detected by the light detector as ordered elements in an array along the first direction of the infrared light sources having emitted the infrared light, as a value indicating the first-direction position, and calculates a center of gravity of the intensity distribution, obtained using coordinates of the intensities of beams of reflected light of infrared light detected by the light detector as ordered elements in an array along the second direction of the infrared light sources having emitted the infrared light, as a value indicating the second-direction position.

* * * * *